US012695255B2

(12) United States Patent
Stumpf et al.

(10) Patent No.: US 12,695,255 B2
(45) Date of Patent: Jul. 28, 2026

(54) ACTIVE COOLING OF BUSBARS USING COMPRESSED AIR

(71) Applicant: Dell Products L.P., Round Rock, TX (US)

(72) Inventors: Michael J. Stumpf, Cedar Park, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 299 days.

(21) Appl. No.: 18/423,022

(22) Filed: Jan. 25, 2024

(65) Prior Publication Data

US 2025/0246862 A1 Jul. 31, 2025

(51) Int. Cl.
H01R 25/14 (2006.01)
H05K 7/20 (2006.01)

(52) U.S. Cl.
CPC ....... H01R 25/145 (2013.01); H05K 7/20409 (2013.01); H05K 7/20736 (2013.01)

(58) Field of Classification Search
CPC ............. H01R 25/145; H05K 7/20409; H05K 7/20736; H05K 7/1492
See application file for complete search history.

(56) References Cited

U.S. PATENT DOCUMENTS

| | | | | |
|---|---|---|---|---|
| 9,762,037 B1 * | 9/2017 | Lach | ...................... | G06F 1/189 |
| 12,477,686 B2 * | 11/2025 | Utz | ................... | H05K 7/20272 |
| 2016/0322281 A1 * | 11/2016 | Shintani | ............. | H05K 7/20927 |
| 2024/0147667 A1 * | 5/2024 | Chen | ................. | H05K 7/20872 |
| 2025/0246839 A1 * | 7/2025 | Utz | ...................... | H01R 13/426 |

FOREIGN PATENT DOCUMENTS

| | | | | | |
|---|---|---|---|---|---|
| CN | 118602843 A | * | 9/2024 | ......... | H05K 7/20281 |
| TW | 202429030 A | * | 7/2024 | ......... | H05K 7/20409 |
| WO | WO-2024227465 A1 | * | 11/2024 | ........... | H01R 13/533 |

* cited by examiner

*Primary Examiner* — Travis S Chambers
(74) *Attorney, Agent, or Firm* — Fogarty LLP

(57) ABSTRACT

A busbar for a computing rack is disclosed. The busbar comprises a pair of electrically conductive rails each having a first end and a second end. The pair of rails are configured to provide opposite voltage polarities to devices mounted in the computing rack. The open channels are enclosed within each of the rails and extend from the first end to the second end in each respective rail. An expansion valve is coupled to the open channels at the first end and is configured to expand air passed from a compressed-air source into the at least one open channel while the pair of rails are attached to an electrical power source. An input end cap is attached to the first end of at least one of the rails. The input end cap provides a manifold for routing air from the expansion value into the at least one open channel.

20 Claims, 8 Drawing Sheets

800

803     802     801

804

900

905    905

905

901

905

903

902

905

904

ACTIVE COOLING OF BUSBARS USING COMPRESSED AIR

BACKGROUND

An Information Handling System (IHS) generally processes, compiles, stores, and/or communicates information or data for business, personal, or other purposes. IHSs may include a variety of hardware and software components that are configured to process, store, and communicate information and may include one or more computer systems, data storage systems, and networking systems. Groups of IHSs may be housed within data center environments. A data center may include a large number of IHSs, such as server chassis that are stacked and installed within racks. A data center may include large numbers of such server racks that are organized into rows of racks. Administration of such large groups of IHSs may require teams of remote and local administrators working in shifts in order to support around-the-clock availability of the data center operations while minimizing any downtime.

As IHS hardware components, such as processors and memory, have increased in speed and power consumption, the amount of heat produced by such components during operation of an IHS has also increased. Often, the temperatures of IHS hardware components must be kept within a well-defined range in order to prevent overheating, instability, malfunction, and/or damage that would lead to a shortened component lifespan and lowered datacenter reliability. Accordingly, cooling systems are used in IHSs in order to remove heat that is generated by hardware components. In passive airflow cooling systems, cooling fans are used to force heated air away from a hardware component, and to ventilate heated air away from cooling fins or other heat dissipating structures of the component. In an active, liquid cooling system, a heat-exchanging cold plate is thermally coupled to an IHS component that is to be cooled, and a chilled fluid is passed through conduits internal to the cold plate in order to remove heat from that component. The heated liquid is then cooled and recirculated.

SUMMARY

Embodiments are directed to a busbar for a computing rack. The busbar comprises a pair of electrically conductive rails each having a first end and a second end. The pair of rails are configured to provide opposite voltage polarities to devices mounted in the computing rack. The open channels are enclosed within each of the rails. The open channels extend from the first end to the second end in each respective rail. An expansion valve is coupled to at least one of the open channels at the first end and is configured to expand air passed from a compressed-air source into the at least one open channel while the pair of rails are attached to an electrical power source. An input end cap is attached to the first end of at least one of the rails. The input end cap provides a manifold for routing air from the expansion value into the at least one open channel.

In some embodiments, the open channels further comprise one or more air-cooling fins extending from an interior wall into the open channel.

In some embodiments, air-turbulence-inducing structures disposed within each of the open channels. The air-turbulence-inducing structures may have a twisted ribbon shape.

The busbar may further comprise an airflow restrictor that is attached to the second end of at least one rail. The airflow restrictor is configured to increase air pressure within the open channel of the at least one rail.

In some embodiments, the busbar further comprises a second pair of electrically conductive rails each having a first end and a second end. Open channels are also enclosed within each of the second pair of rails and extend from the first end to the second end of the second pair of rails. The expansion valve is coupled to the first end of at least one channel in the second pair of rails and is configured to expand air passed from the compressed-air source into the at least one channel in the second pair of rails while the second pair of rails are attached to the electrical power source. In this configuration, the first set of rails may provide power to an upper portion of a computing rack while the second set of rail provides power to a lower portion of the rack.

BRIEF DESCRIPTION OF THE DRAWINGS

Figure 1:
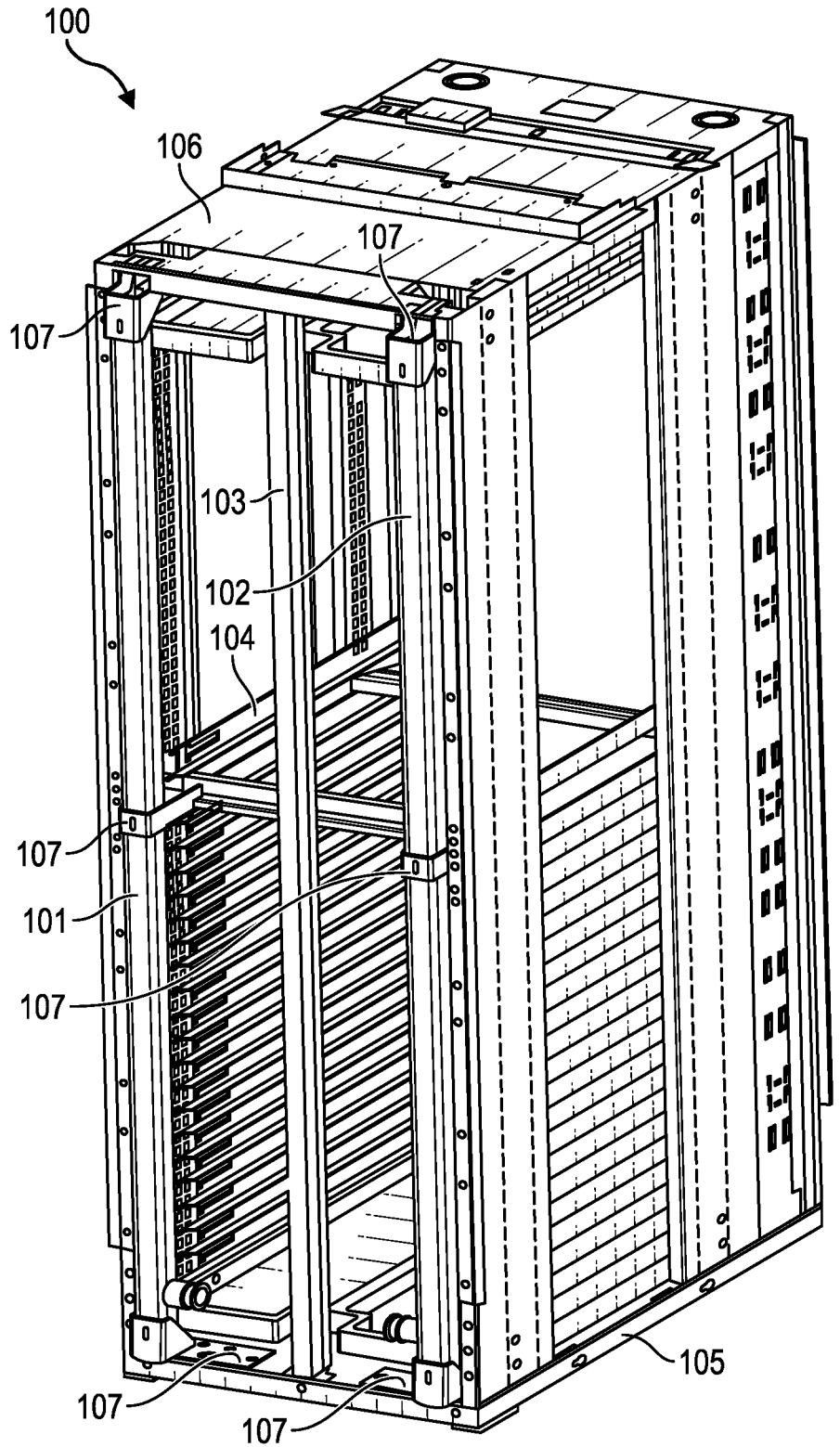

Having thus described the invention in general terms, reference will now be made to the accompanying drawings, which are not necessarily drawn to scale, and wherein:

FIG. 1 shows a computing rack that includes liquid cooling manifolds and a busbar according to embodiments.

Figure 2:
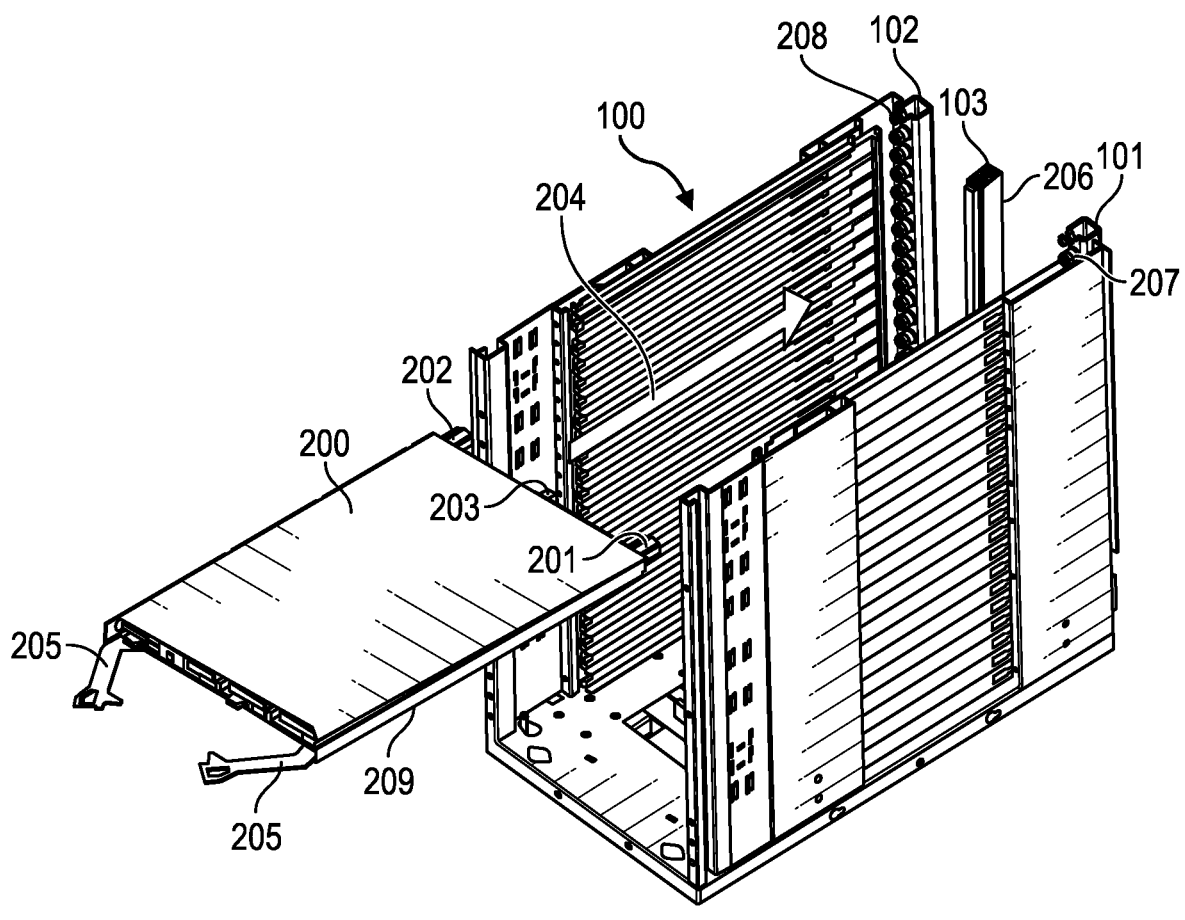

FIG. 2 is a front-view illustration of a server IHS being inserted into a slot of the computing rack shown in FIG. 1.

Figure 3:
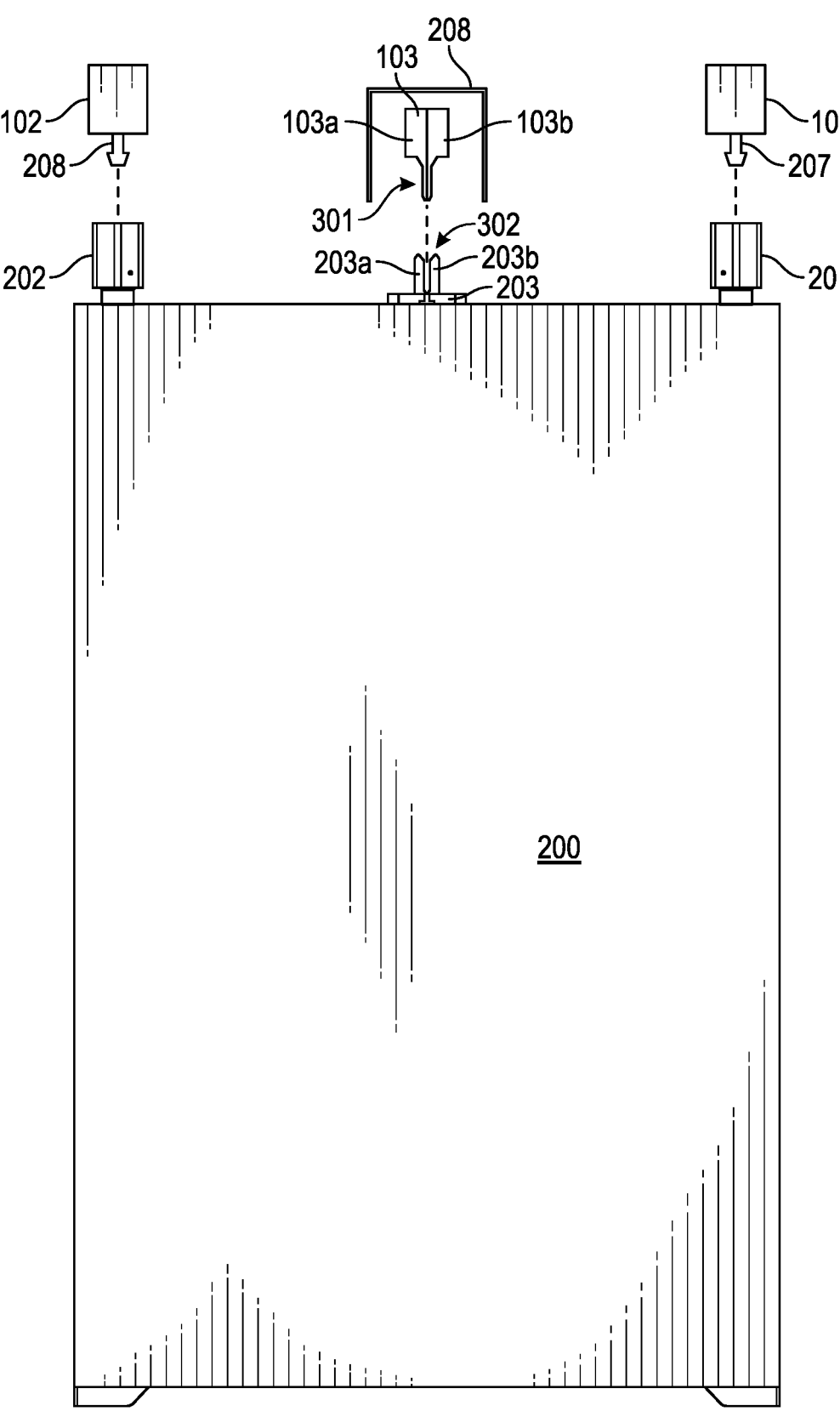

FIG. 3 is a top view of a server IHS 200 making power and cooling connections while being installed into the computing rack shown in FIG. 1.

Figure 4:
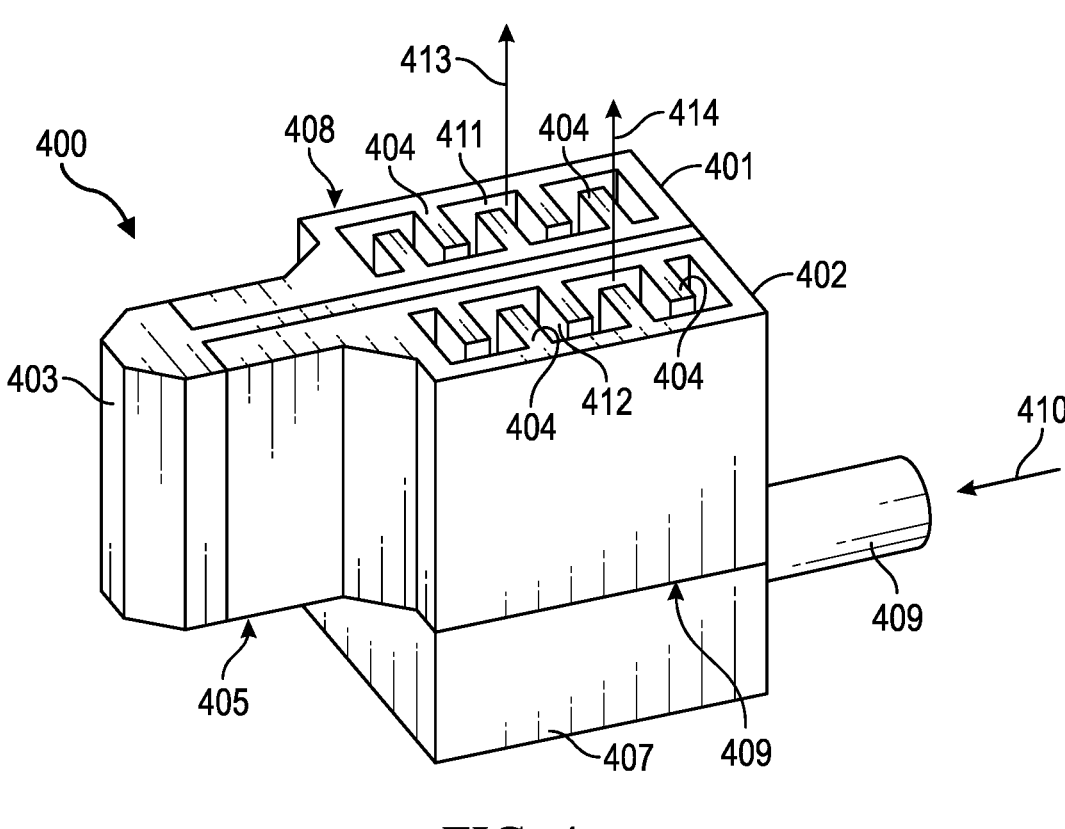

FIG. 4 illustrates a compressed-air-cooled busbar with internal fins for air cooling.

Figure 5:
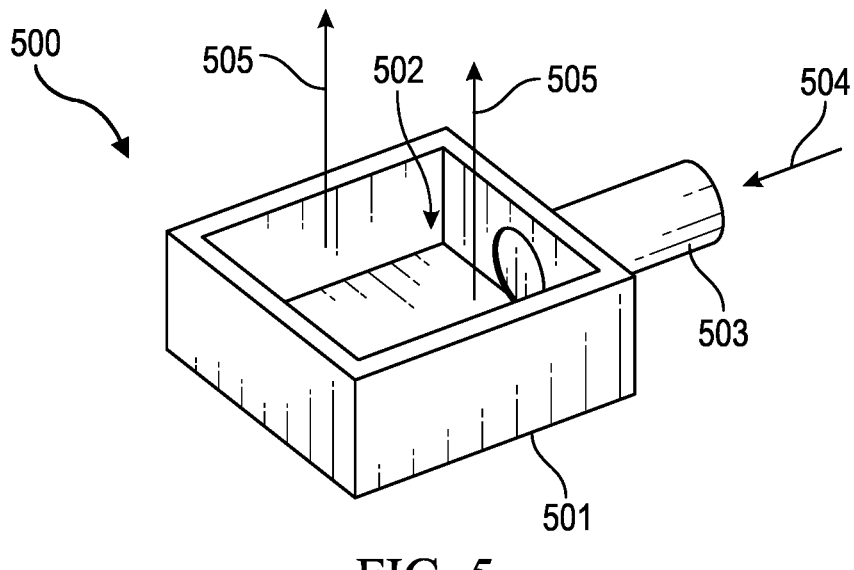

FIG. 5 illustrates an example end cap used in some embodiments of the compressed-air-cooled busbar.

Figure 6:
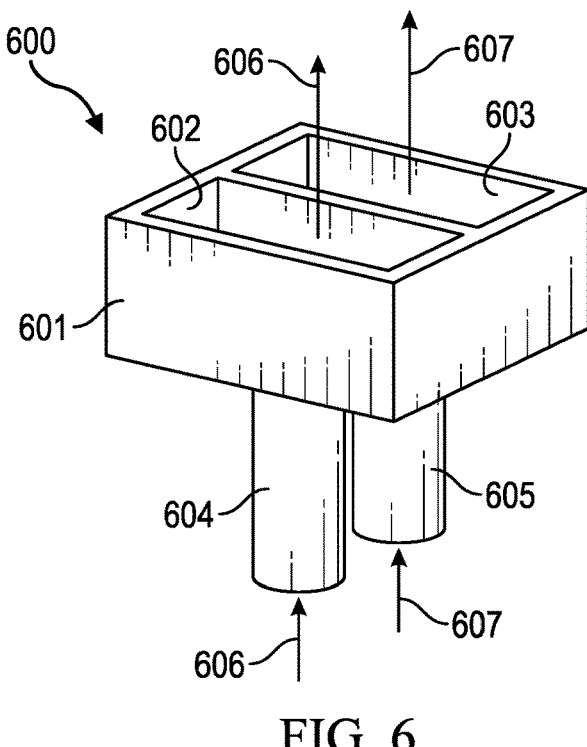

FIG. 6 illustrates an alternative end cap used in some embodiments of the compressed-air-cooled busbar.

Figure 7:
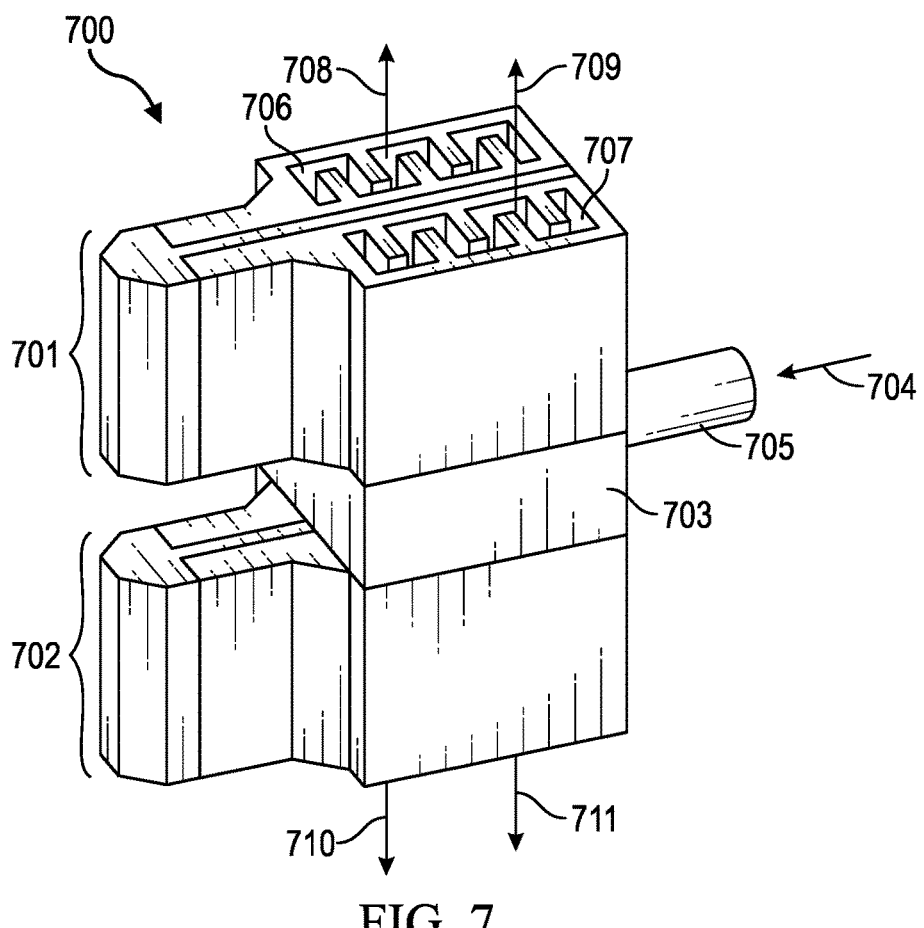
Figure 8:
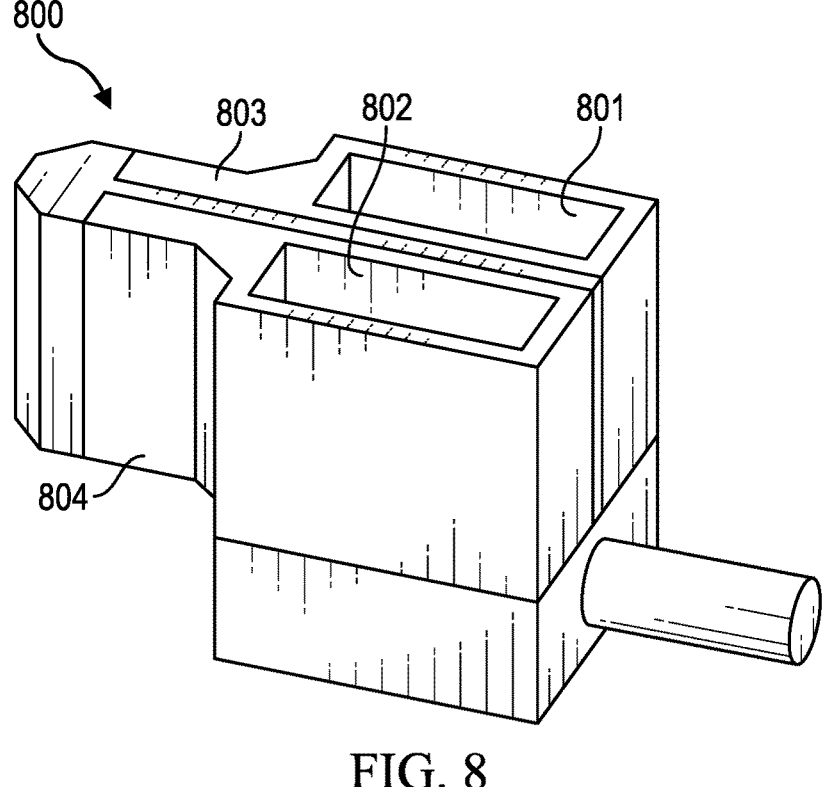

FIG. 7 illustrates another embodiment of a compressed-air-cooled busbar having separate upper and lower segments FIG. 8 illustrates a compressed-air-cooled busbar with unobstructed internal channels for air cooling.

Figure 9:
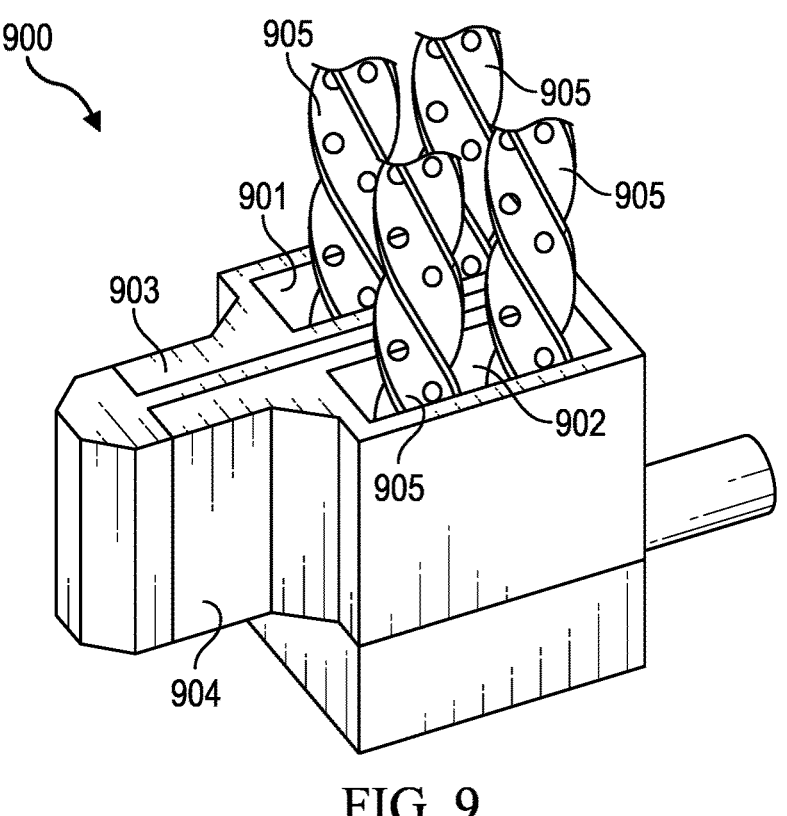

FIG. 9 illustrates a compressed-air-cooled busbar with internal channels having turbulence-inducing structures to enhance air cooling.

Figure 10:
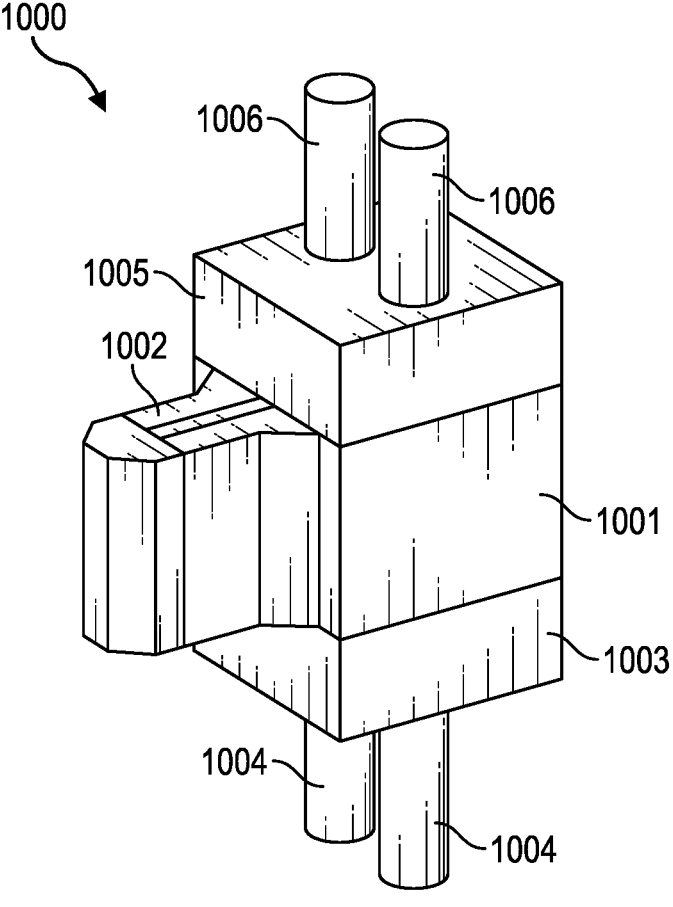

FIG. 10 illustrates a compressed-air-cooled busbar having an exit restriction device.

Figure 11:
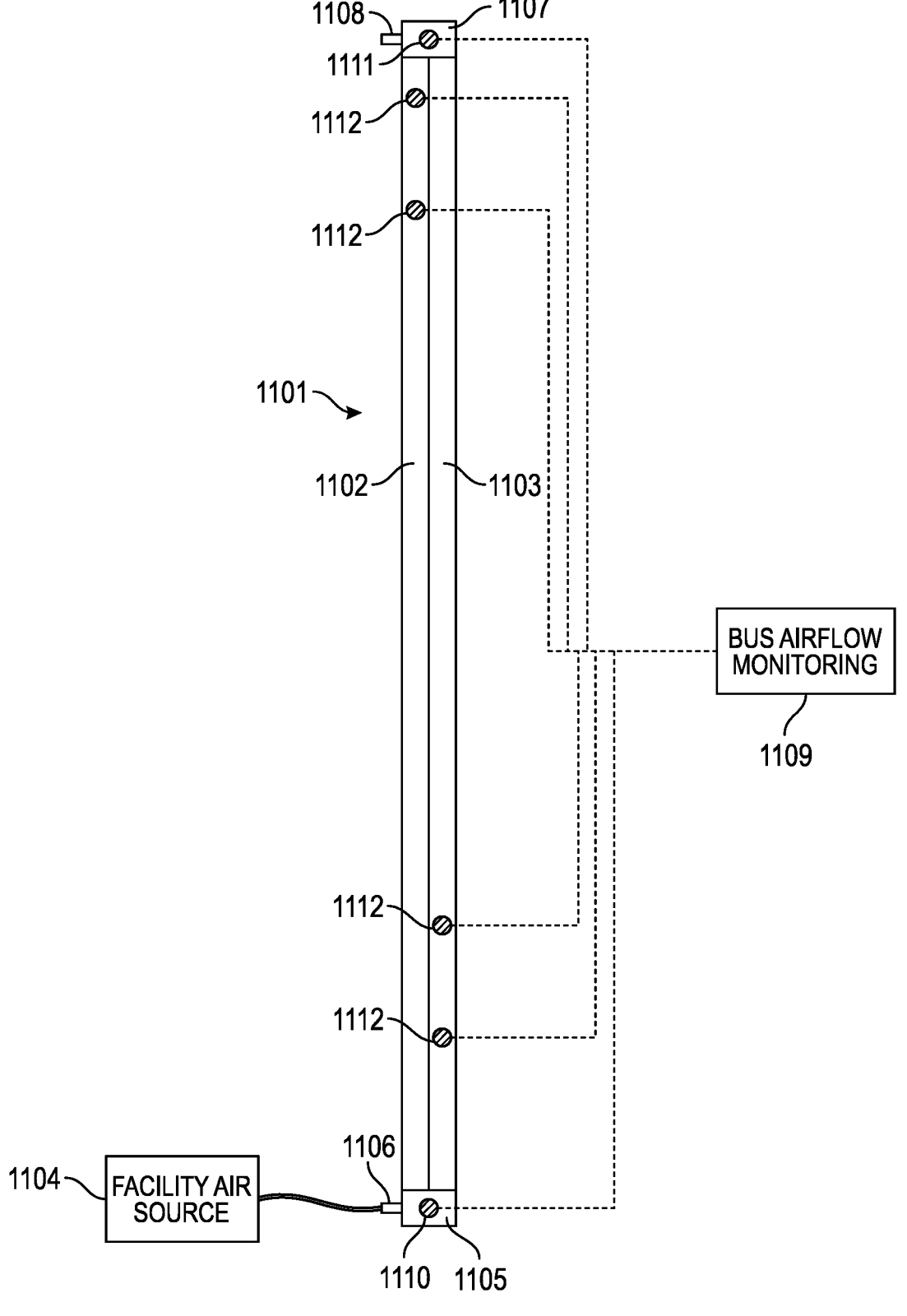

FIG. 11 illustrates a monitoring system for a compressed-air busbar cooling system.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

The embodiments disclosed herein provide a method for using commonly available facility-level cooled compressed air as a way of safely extracting heat from a server rack busbar. The design of the busbar achieves a greater current capacity and/or a greater safety margin. The busbar design adds a layer of safety margin to the busbar against long-term heat deformation, thereby improving mechanical tolerances. The busbar design adapts and modifies common, off-theshelf hollow busbars components to form an improved busbar system with higher performance and longevity than existing busbars.

The busbar design takes advantage of internal air cooling that avoids the manufacturing challenges that would be associated with insulating the interior channels of the busbar to use liquid cooling. Compared to liquid-cooled busbars, the design disclosed herein is safer compared to liquid-cooled busbar approaches that can fail due to a single scratch in protective insulation, which is an elevated risk with higher busbar voltages. The design of the compressed-air-cooled busbar avoids the mess and fire hazard risks in case of leaks in liquid-cooled systems.

The compressed-air-cooled busbar provides long term stability by keeping heat load very low and prevents exothermic events in case of insufficient air flow, mis-manufacture of busbar contacts, wear- or heat-related contact performance degradation, or failure of facility cold air. Insufficient facility cold air in existing systems can push the busbar into a failure state due to higher heat loads and lack of normal heat dissipation.

The methods disclosed herein provide heat removal that works both by expansion of air and conventional air cooling against thermally conductive surfaces using internal airflow within the rails of a busbar. In one configuration, the busbar design contains internal cooling fins that are designed to maximally transfer heat into expelled air. In another configuration, the busbar design contains a large cavity that contains turbulence-inducing devices to extract more heat. A split busbar electrically isolating interface is disclosed that can simultaneously feed a dual-path split busbar, thereby cooling both halves at the same time. Additionally, a dual-sided busbar endcap is disclosed that restricts exit airflow to achieve certain performance advantages, (e.g., via dwell time or increased pressure) and extract more heat. Airflow discharged from the busbar may be exhaust as waste air into the hot aisle of a datacenter.

In a further embodiment, integrated temperature, airflow, and pressure sensing devices on the ends of the busbar may be used to add smart features such as heat dissipation monitoring.

FIG. 1 is an illustration of a computing rack 100 that includes liquid cooling manifolds 101, 102 and busbar 103, according to embodiments. Computing rack 100 may conform to any appropriate standard or proprietary design and, in particular, may conform to ORv3. FIG. 1 is a rear-facing view of a partially assembled computing rack 100. In some instances, rack 100 includes a frame structure, that may include side panels with rails, brackets, guides, or other components for receiving hardware that is installed in one or more slots 104 of the rack 100. Such hardware may include, for example, a chassis housing one or more of a server, processing unit, memory/storage device, cooling unit, or the like combined to form an Information Handling System (IHS). The frame structure of rack 100 may include a base 105 and a top cover 106 that may be connected via any number of vertical panels, braces, posts, supports, etc.

In the rear-facing view of FIG. 1, the length of busbar 103 is visible as it extends the vertical height of the rack 100, from the base 105 to the top cover 106 in providing a shared supply of power for the hardware components that are installed in the rack 100. Also visible in FIG. 1 is the full length of the liquid cooling manifolds 101, 102 that also extend the vertical height of the rack 100. In the illustrated embodiment, each of the liquid cooling manifolds 101, 102 are attached to the rack 100 via brackets 107. Through the fastening of brackets 107, each of the liquid cooling manifolds 101, 102 is firmly fixed to rack 100. The couplings (not shown) of the liquid cooling manifolds 101, 102 are aligned with rack, and thus with liquid cooling couplings of a chassis or server when installed in a slot of the rack 100. Aligned in this manner, an administrator is able to insert a chassis into the rack 100 and apply force on the chassis until liquid cooling couplings of the chassis are connected with corresponding couplings of the liquid cooling manifolds 101, 102. Similarly, busbar 103 extends the height of computing rack 100 and provides power to each chassis, server, or other IHS component installed in slots on rack 100.

FIG. 2 is a front-view illustration of a server IHS 200 being inserted into a slot of computing rack 100. The server 200 may share resources provided by the rack 100, such as shared cooling and power. Accordingly, insertion of server IHS 200 into a slot of rack 100 couples the liquid cooling couplings 201, 202 on server IHS 200 to liquid cooling manifolds 101, 102, respectively. Power coupling 203 on server IHS 200 is coupled to busbar 103. In a data center environment, server IHS 200 may be installed within a rack 101 along with other similar chassis, such as other server IHSs, that are likewise installed in one or more slots where some or all of these chassis may be similarly coupled to liquid cooling manifolds 101, 102 and busbar 103 provided by the rack 101. Rack 101 includes multiple slots in which a server IHS 200 or similar chassis can be physically inserted by an administrator, where the server IHS 200 is inserted by force applied by an administrator in the direction 204 illustrated in FIG. 2. The sever IHS 200 may be securely locked in place the rack 100 by closing latches 205, which engage with the front edge of rack 100.

When installing server IHS 200 within rack 100, the force applied in direction 204 by the administrator couples the server 200 to shared infrastructure resources of the rack 100. For instance, the server IHS 200 is securely coupled to a busbar 103, which provides the server 200 with a supply of power. The busbar 103 provides a shared power supply used by some or all of the hardware installed in rack 100. Busbar 103 is partially enclosed within shielding 206, which prevents administrators or other users from touching the back or sides of busbar 103 to reduce risk of electrical shock.

In addition, the force applied by the administrator in direction 204 couples the server IHS 200 to liquid cooling manifolds 101, 102 provided by the rack 100. An inlet coolant manifold distributes cooled liquid from a recirculation system (not shown) to server IHS 200, and an outlet coolant manifold receives heated liquid from server IHS 200, which is returned to the recirculation system to be cooled. In the illustrated embodiments, the liquid cooling manifolds 101, 102 may be arranged with either of the manifolds functioning as the inlet manifold and the other as the outlet manifold, with this arrangement selected to correspond to arrangement of liquid cooling couplings 201, 202 of the server IHS 200 and of the other server IHSs or other hardware using the shared liquid cooling resources supported by rack 100. The use of liquid cooling manifolds 101, 102 enables the cooling of multiple servers and/or other hardware by a single cooling source (e.g., the liquid recirculation system).

Through the force applied by the administrator in direction 204, liquid cooling couplings 201, 202 of the server IHS 200 are connected to corresponding couplings 207, 208 of each of the liquid cooling manifolds 101, 102. Once coupled, the liquid cooling couplings 201, 202 are connected to internal inlet and outlet liquid coolant lines in the server IHS 200. In some embodiments, the liquid cooling couplings 201, 202 of the server IHS 200 and the couplings 207, 208 of the liquid cooling manifolds 101, 102 may be quick-connect couplings that can be connected without use of tools and solely via the force applied by the administrator in direction 204. Through the use of such quick-connect couplings, the coupling of server IHS 200 to the liquid cooling manifolds 101, 102 may thus be completed blindly by the administrator that is inserting the server into a slot in the rack 100, while unable to view the liquid cooling couplings 201, 202 that are being connected.

In many instances, racks 100 are constructed according to standardized dimensions that define the vertical and horizontal dimensions of hardware components, such as one or more server IHSs 200, that can be installed within such racks. Standardized rack dimensions specify vertical units of space within a rack, where such vertical units of rack space may be referred to as RUs (Rack Units). In some instances, a server IHS 200 may be one rack unit (1RU) in height and may house a single IHS. In other instances, an individual sever IHS installed in a rack 100 may be multiple rack units in height and may include multiple IHSs. The chassis may conform to an integer number of rack units, such as 1 OU or RU, 2 OU or RU, or the like. The chassis 200 may be any appropriate size configured to fit within the rack 100. For example, a 2RU chassis may include a pair of front-facing bays that are each 1RU in height. In such a chassis, each of the bays may receive a 1RU IHS that may be separately administered and may be a replaceable component that may be coupled and de-coupled from a chassis. In such instance, the 2RU chassis may be coupled to liquid cooling manifolds 101, 102 of rack 100 and may provide cooling for the 1RU IHSs that are installed in the chassis.

Server IHS 200 and other hardware may be installed within one or more slots that are supported by the rack 100, where use of multiple slots may correspond to the server being multiple RUs in height. Through insertion in slots supported by the rack 100, server IHS 200 may be reliably located relative to the rack itself, at least with respect to vertical and horizontal positioning of the server relative to the rack. Such positioning of the server IHS 200 may be supported by various guides and/or other structures that are located along the sides 209 of the outer enclosure of the server. These guides along the sides 209 of the server are received by corresponding rails or other precisely positioned structures along the inner walls of the rack 100.

FIG. 3 is a top view of a server IHS 200 making power and cooling connections while being installed in a rack 100. Cooling manifolds 101, 102 extend vertically along the backside of rack 100. Liquid cooling couplings 201, 202 on server IHS 200 are configured to connect to cooling manifolds 101, 102 via male connectors 207, 208. Although not shown in FIG. 3, it is understood that each of the cooling manifolds 101, 102 may include a set of male connectors 207, 208 for any given rack unit along the height of the rack 100. Furthermore, the particular connectors 201, 202, 207, 208 are for example only, and the scope of implementations may be adapted to use any appropriate liquid cooling connector. In various implementations, the manifold cooling connectors 207, 208 and the server IHS cooling connectors 201, 202 may be either male or female.

Busbar 103 also extends vertically along the backside of rack 100. Busbar 103 is divided horizontally into two electrically isolated halves 103a, 103b that are assigned respective positive and negative, or high-low voltage, polarities for electrical power provided to server IHS 200. Computing racks complying with ORv3 use a DC busbar for power delivery. The typical busbar voltage is 48-54 Vdc and the busbar current can be as high as 3000 A to support 140

KW racks. Power coupling 203 has two sides 203a, 203b corresponding to the polarity of busbar 103. A protrusion or ridge 301 runs vertically along busbar 103 and is configured to fit snugly between prongs 203a, 203b of power coupling 203 to ensure a tight electrical connection.

The current-carrying capacity of busbar 130 is determined by the maximum temperature at which the bar is permitted to operate, which is typically defined as a maximum temperature rise in standards such as ANSI C37.20 for switchgear assemblies including metal-enclosed bus. As the operating temperature increases, the rate of surface oxidation of the conductor material increases rapidly, which limits the lifetime of the busbar. Accordingly, if the busbar can be cooled, then the busbar will be able to carry more current or safety margins for the busbar can be increased. Cooling busbar 103 will increase the thermal safety margin for rack 100, increase the current-carrying capacity of busbar 103, increase contact reliability with server IHS 200, and will decrease power loss. Convection cooling can be used to transfer heat away from busbar 103. Air cooling of busbar 103 is difficult in environments such as computing rack 100 where server IHS 200 are liquid cooled. Such computing racks require minimal air cooling so that the available airflow through the rack 100 is reduced compared to air-cooled racks. Additionally, protective shielding 206 blocks or reduces airflow near busbar 103 even if the shielding 206 is formed from a perforated or screen material. Liquid cooling of busbars is difficult to achieve due to manufacturing issues and the insulation requirements to prevent energizing the liquid cooling.

In an example embodiment, compressed air may be used to add active cooling to busbar 103. Busbar 103 may comprise a common, off-the-shelf, hollow busbar, which are available in many shapes. Existing hollow busbars are configured with ambient air in the hollow portion. In busbar 103, facility compressed air is connected through an expansion valve or vortex tube. On expansion, the compressed air becomes very cold. The cold, fast-moving air is injected into one end of the busbar 103 cavity, which actively cools the busbar. Waste heat is transferred to the airflow and exhausted out the other end of the busbar 103 cavity.

FIG. 4 illustrates a busbar 400 with internal fins for air cooling. Busbar 400 has two sides 401, 402, such as a high side and a low side or a positive and a negative side, that are electrically isolated by an insulator 403. Each side 401, 402 is a separate hollow extruded busbar with internal fins 404. Busbars 401, 402 may be manufactured from copper, aluminum, or other appropriate metal or alloy for providing electrical connections in a computer rack environment. Busbar 405 has a protrusion or ridge 405 that is configured to connect to the power coupling on a chassis, such as coupling 203 on server IHS 200. The bottom end 406 of busbar 400 is attached to an end cap manifold 407. The top end 408 of busbar 400 is open.

Compressed air 410 enters end cap 407 through expansion valve 409, which causes the compressed air to expand thereby cooling the air. The end cap 407 acts as manifold to distribute cold air into cooling channels 411 and 412 within the busbar portions 401, 402. End cap 407 may electrically isolate expansion valve 409 from busbar 400. For safety, the expansion valve 409 is mounted on an electrical isolator to provide insulation from the busbar voltage.

The cooled air then flows from end cap 407 into the hollow interiors 411, 412 of busbar portions 401, 402. Heat from busbar 400 is transferred to the airflow. The internal fins 404 function as an inverted heat sink to maximize heat transfer from busbars 401, 402 to the airflow. The heated airflow moves upward within busbars 401, 402 and is exhausted 413, 414 at open top end 408. The heated air 413, 414 may be exhaust into a hot aisle of a datacenter, for example.

While only a portion of busbar 400 is shown, it will be understood that busbar 400 runs along the entire vertical length of a computing rack so that electrical power is available to all slots in the rack. End cap manifold 407 is located generally at the bottom end of the computing rack and open top end 408 is located generally at the top of the computing rack. In other embodiments, the input air and end cap manifold 407 may be located at the top end of the computing rack with air flowing downward to an open end at the bottom of the busbar and the bottom of the computing rack.

FIG. 5 illustrates an example end cap 500 used in some embodiments of the compressed-air-cooled busbar. End cap manifold 501 has a single open cavity 502. An expansion valve 503 is attached to one wall of end cap manifold 501. In other embodiments, expansion valve 503 may be attached to any of the walls of end cap manifold 501 or to the bottom of end cap manifold 501. Compressed air 504 enters expansion valve 503 and flows into cavity 502. The expansion valve 503 swirls the compressed air and causes the air temperature to drop. The cooled air 505 then flows from cavity 502 into both open channels within each of the busbar sides.

FIG. 6 illustrates another example end cap 600 used in embodiments of the compressed-air-cooled busbar. End cap manifold 601 has two isolated cavities 602, 603. Each cavity is connected to a separate expansion valve 604, 605. While the illustrated example shows the expansion valves 604, 605 attached to the bottom of end cap manifold 601, in other examples the expansion valves 604, 605 may be attached to a sidewall of the end cap manifold 601. Depending on design requirements, the expansion valves 604, 605 may be located on the same side of the end cap manifold 601 or on different sides. Separate streams of compressed air 606, 607 enter expansion valves 604, 605. The streams 606, 607 may be from the same source, such as facility compressed air. The streams 606, 607 flow into respective cavities 602, 603. The expansion valves 604, 605 swirl and expand the compressed air and causes the air temperature to drop. The cooled air 608, 609 then flows from cavities 602, 603 into both open channels within each of the busbar sides.

As noted above, a single busbar 400 (FIG. 4) is configured to provide power to an entire rack of server IHSs so that the cooling air flows the entire length of the computing rack within busbar portions 401, 402. The base rack height for an ORv3 computing rack is 2054.2 mm (80.9 in), which is over 6.5 feet tall. Air flowing through a six foot long heated copper busbar will warm significantly so that the end of the busbar will receive less cooling effect than the bottom of the busbar. FIG. 7 illustrates another embodiment of a compressed-air-cooled busbar 700 that comprises an upper segment 701 and a lower segment 702. The upper and lower segments 701, 702 are separated by a manifold 703. This configuration injects the cooling air approximately in the middle of the busbar and allows the cooling air to flow in both directions. Accordingly, the open ends of the busbar are only half the distance from the air source compared to the example shown in FIG. 4.

Compressed facility air 704 enters expansion valve 705 and flows into end cap manifold 703 after being swirled, expanded, and cooled. The cooled air is then directed upward through the open interiors 706, 707 of top segment 701 and downward through the open interior of bottom segment 702. After absorbing heat from the upper segment 701, warmed air 708, 709 exits the top end of busbar 700. Similarly, after absorbing heat from the lower segment 702, warmed air 710, 711 exits the bottom end of busbar 700. In various configurations, the positioning of manifold 703 may be located in the middle of busbar 700 between approximately equal length segments 701, 702. Alternatively, manifold 703 may be positioned offset from the middle of busbar 700 so that the cooling air flows through a one segment that is shorter than the other. In this configuration, server IHSs that draw more current and thereby cause more busbar heating may be inserted in a computing rack to connect to a shorter busbar segment, which has competition for cooling air across its length.

FIG. 8 illustrates another version of a compressed-air-cooled busbar 800. Instead of having internal fins for air cooling, the channels 801, 802 in both sides 803, 804 of busbar 800 are simple open areas. Having a simple opening 801, 802 in each side of busbar 800 make manufacture of the components easier and cheaper because the internal fins do not have to be extruded or cut into busbar components 803, 804. Although shown as a rectangular opening in FIG. 8, the central channels 801, 802 may have any cross section such as a circle, oval, square, etc. found in any off-the-shelf busbar material.

FIG. 9 illustrates a further version of a compressed-air-cooled busbar 900. Similar to busbar 800 in the example shown in FIG. 8, the channels 901, 902 in segments 903, 904 of busbar 900 have simple open cross sections without internal fins. Twisted ribbons or cables 905 are inserted within the open channels 901, 902 to create turbulent airflow, which improves heat removal from busbar segments 903, 904. The swirling characteristics of turbulent air flow enhances heat transfer. Mixing of the air within channels 901, 902 that is induced by turbulent air flow also disrupts the boundary layer along the inner surfaces of channels 901, 902 surfaces. Although shown as a twisted ribbon or cable 905 in FIG. 9, it will be understood that other methods of inducing turbulent air flow can be used, such as roughening the inner surface of channels 901, 902 or otherwise inducing changes to the speed or direction of the air flow.

FIG. 10 illustrates a compressed-air-cooled busbar 1000 having an exit restriction. Busbar segments 1001 and 1002 receive compressed air from end cap manifold 1003, such as end cap 600 (FIG. 6). One or more expansion valves 1004 cause the inlet compressed air to expand and cool before entering busbar segments 1001, 1002 via end cap manifold 1003. A second end cap 1005 is attached at the top end of busbar segments 1001, 1002 to restrict air exiting the busbar. Air flow restrictors or regulators 1006 control the air flow out of second end cap 1005. Restrictors 1006 increase the air pressure inside busbars 1001, 1002 by limiting the rate at which waste air leaves busbar 1000. Pressurized air within busbar segments 1001 and 1002 can carry more heat. Additionally, restrictors 1006 increase the dwell time for the cold air inside busbars 1001, 1002, which leads to more efficient cooling. In other embodiments, instead of using an end cap 1004, the air pressure within busbars 1001, 1002 can be increased using other restrictors, pressure valves, or regulators. The top end cap manifold 1004 may also be used to separate the air channels within each busbar 1001, 1002 to ensure even flow between the two segments.

FIG. 11 illustrates a monitoring system for a compressed-air busbar cooling system. A busbar 1101 for a computing rack, such as rack 100 (FIG. 1), comprises two segments 1102, 1103 that correspond to the high and low voltage portions of the busbar. When installed in a datacenter environment, for example, the facility will typically have a source of compressed air 1104, such as one or more air storage containers that hold compressed air or one or more compressors that supply compressed air to the air storage containers. The facility air is provided to a busbar end cap manifold 1105 via an expansion valve 1106. There may be one expansion valve and one end cap manifold for each busbar segment 1102, 1103 or a single expansion valve and/or end cap manifold may service both busbar segments 1102, 1103. The facility compressed air is swirled and expanded in expansion valve 1106 which cools the air before it flows into the busbar segments 1102, 1103. The cool air flows through an open channel in each busbar segment 1102, 1103 and absorbs heat from the busbar 1101. The heat is generated when the busbar 1101 provides power to one or more server IHSs that are coupled to the busbar. In the illustrated example, the cooling air flows upward and out of the busbar segments 1102, 1103. The air may then exit directly from the top end of the busbar segments 1102, 1103 or it may be routed through a top end cap 1107. The top end cap 1107 may include a restrictor or regulator 1108 to manage the pressure of the air within busbar segments 1102, 1103. The heated air leaving busbar segments 1102, 1103 may be routed to a hot aisle of a datacenter.

A busbar airflow monitoring system 1109 may be used to monitor and control the operation of the compressed-air busbar cooling system. Airflow monitoring system 1109 communicates with smart airflow and temperature sensing devices that are used to detect characteristics of the cooling air. For example, one or more ingress sensors 1110 may monitor the ingress air temperature and/or pressure, and one or more egress sensors 1111 may monitor the egress air temperature and/or pressure. Additional sensors 1112 distributed through the channels in busbar segments 1102, 1103 may be used to monitor airflow speed and air pressure. The information captured by sensors 1110-1112 is sent to busbar airflow monitoring system 1109, which may be a rack-level monitoring device or may be a system that monitors racks in an entire datacenter. The data from sensors 1110-1112 may be used to determine changes in temperature and pressure across busbar 1101. This information may be used to create profiles of different individual or combinations of server IHSs and their effect on busbar temperatures. Such information and profiles may then be used to determine whether certain server IHSs should be moved closer to the cooling air source or whether entire racks should be placed in a cooler location within the datacenter. The busbar airflow monitoring system 1109 may provide alerts and reports to a datacenter administrator.

In an example embodiment, a busbar for a computing rack comprises an electrically conductive rail having a first end and a second end. The rail may be manufactured from copper, aluminum, or any appropriate electrically conductive metal or alloy that is capable of carrying the current required by server chassis installed in the computing rack. A channel is enclosed within the rail. The channel extends from the first end to the second end of the rail like the hollow opening in a tube, pipe, or straw. The channel may comprise an open space through the rail where the channel has a consistent cross-section shape from the first end to the second end, such as a circular, oval, square, or rectangular shape. Other shapes, such as interspaced cooling fins or fingers may be used in the channel cross section. An expansion valve is coupled to the channel at the first end. The expansion valve is configured to expand air that is passed from a compressed-air source into the channel while the rail is attached to an electrical power source. The expansion valve causes the compressed air to cool as a result of the pressure drop. This cooled air flows through the channel in the rail and absorbs heat from the rail, such as heat generated by passing current through the rail from the electrical power source.

The busbar may further comprise an input end cap that is attached to the first end of the rail. The input end cap provides a manifold for routing air from the expansion value into the channel.

In some embodiments, one or more air-cooling fins, such as heat exchanger or heat sink fins, may extend from an interior wall of the rail into the channel.

In some embodiments, an air-turbulence-inducing structure may be placed within the channel. The air-turbulence-inducing structure may have a twisted ribbon shape, such a twisted plastic insert placed in the channel.

The busbar may further comprise an airflow restrictor that is attached to the second end of the rail. The airflow restrictor is configured to increase air pressure within the channel by limiting the airflow exhausted from the channel.

The busbar may further comprise a second electrically conductive rail having a first end and a second end. In some embodiments, the second conductive rail may be identical to the first conductive rail or may be a mirror image of the first conductive rail. A second channel is enclosed within the second rail. The second channel extends from the first end to the second end. The expansion valve is coupled to the first end of the second channel and is configured to expand air passed from a compressed-air source into the second channel while the second rail is attached to the electrical power source. The first rail and the second rail may be configured to provide different voltage polarities or different voltage levels to devices mounted in the computing rack.

In another example embodiment, a busbar for a computing rack comprises a pair of electrically conductive rails each having a first end and a second end. Open channels are enclosed within each of the rails. The open channels extend from the first end to the second end in the rails. An expansion valve is coupled to at least one of the open channels at the first end. The expansion valve is configured to expand air passed from a compressed-air source into the at least one open channel while the pair of rails are attached to an electrical power source. A pair of rails may be configured to provide opposite voltage polarities to devices mounted in the computing rack.

The busbar may further comprise an input end cap that is attached to the first end of at least one of the rails. The input end cap provides a manifold for routing air from the expansion value into the at least one open channel.

In some embodiments, the open channels may each further comprise one or more air-cooling fins extending from an interior wall of the rail into the open channel.

In some embodiments, air-turbulence-inducing structures may be located within each of the open channels. The air-turbulence-inducing structures may have a twisted ribbon shape.

An airflow restrictor may be attached to the second end of at least one rail. The airflow restrictor may be configured to increase the air pressure within the open channel of the at least one rail.

The busbar may include a second pair of electrically conductive rails each having their own first end and second end. Open channels are enclosed within each of the second pair of rails. The open channels extend from the first end to the second end of the second pair of rails. The expansion valve may be coupled to the first end of at least one channel in the second pair of rails and configured to expand air passed from the compressed-air source into the at least one channel in the second pair of rails while the second pair of rails are attached to the electrical power source. The expansion valve in this configuration could provide air to both pairs of rails.

In a further example, a computing rack comprises a plurality of slots for installation of Information Handling Systems (IHSs). The rack comprises a busbar configured to provide electrical power to the IHSs. The busbar has a first rail carrying a first voltage level. The first rail has an internal channel that extends from a bottom end of the busbar to a top end of the busbar. The busbar also has a second rail carrying a second voltage level. The second rail has an internal channel extending from a bottom end of the busbar to a top end of the busbar. An end cap manifold is configured to route airflow into the internal channels at the bottom end of the busbar. An expansion valve is coupled to the end cap manifold and is configured to expand air received from a compressed air source. The internal channels may further include one or more of air-cooling fins that extend from an interior wall of the rail into the channel or may include air-turbulence-inducing structures disposed within each of the channels. One or more airflow restrictors may be attached to the second end of the first and second rails. The one or more airflow restrictors are configured to increase air pressure within the interior channel of the rails.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

What is claimed is:

1. A busbar for a computing rack, the busbar comprising:
an electrically conductive rail having a first end and a second end;
a channel enclosed within the rail, the channel extending from the first end to the second end; and
an expansion valve coupled to the channel at the first end and configured to expand air passed from a compressed-air source into the channel while the rail is attached to an electrical power source.

2. The busbar of claim 1, further comprising:
an input end cap attached to the first end of the rail, the input end cap providing a manifold for routing air from the expansion valve into the channel.

3. The busbar of claim 1, wherein the channel comprises an open space through the rail having a consistent cross-section shape from the first end to the second end.

4. The busbar of claim 1, wherein the channel comprises one or more air-cooling fins extending from an interior wall into the channel.

5. The busbar of claim 1, further comprising:
an air-turbulence-inducing structure disposed within the channel.

6. The busbar of claim 5, wherein the air-turbulence-inducing structure has a twisted ribbon shape.

7. The busbar of claim 1, further comprising:
an airflow restrictor attached to the second end of the rail, the airflow restrictor configured to increase air pressure within the channel.

8. The busbar of claim 1, further comprising:
a second electrically conductive rail having a first end and a second end;
a second channel enclosed within the second rail, the second channel extending from the first end to the second end; and
the expansion valve coupled to the first end of the second channel and configured to expand air passed from a compressed-air source into the second channel while the second rail is attached to the electrical power source.

9. The busbar of claim 1, wherein the rail is configured to provide one voltage polarity to devices mounted in the computing rack.

10. A busbar for a computing rack, the busbar comprising:
a pair of electrically conductive rails each having a first end and a second end;
open channels enclosed within each of the rails, the open channels extending from the first end to the second end in a respective rail; and
an expansion valve coupled to at least one of the open channels at the first end and configured to expand air passed from a compressed-air source into the at least one open channel while the pair of rails are attached to an electrical power source.

11. The busbar of claim 10, further comprising:
an input end cap attached to the first end of at least one of the rails, the input end cap providing a manifold for routing air from the expansion valve into the at least one open channel.

12. The busbar of claim 10, wherein the open channels each further comprise one or more air-cooling fins extending from an interior wall into the open channel.

13. The busbar of claim 10, further comprising:
air-turbulence-inducing structures disposed within each of the open channels.

14. The busbar of claim 13, wherein the air-turbulence-inducing structures have a twisted ribbon shape.

15. The busbar of claim 10, further comprising:
an airflow restrictor attached to the second end of at least one rail, the airflow restrictor configured to increase air pressure within the open channel of the at least one rail.

16. The busbar of claim 10, further comprising:
a second pair of electrically conductive rails each having a first end and a second end;
open channels enclosed within each of the second pair of rails, the open channel extending from the first end to the second end of the second pair of rails; and
the expansion valve coupled to the first end of at least one channel in the second pair of rails and configured to expand air passed from the compressed-air source into the at least one channel in the second pair of rails while the second pair of rails are attached to the electrical power source.

17. The busbar of claim 10, wherein the pair of rails is configured to provide opposite voltage polarities to devices mounted in the computing rack.

18. A computing rack comprising a plurality of slots for installation of Information Handling Systems (IHSs), the rack comprising:

a busbar configured to provide electrical power to the IHSs, the busbar comprising:

a first rail having a first voltage level, the first rail having an internal channel extending from a bottom end of the busbar to a top end of the busbar;

a second rail having a second voltage level, the second rail having an internal channel extending from a bottom end of the busbar to a top end of the busbar;

an end cap manifold configured to route airflow into the internal channels at the bottom end; and an expansion valve coupled to the end cap manifold and configured to expand air received from a compressed air source.

19. The computing rack of claim 18, wherein the internal channels each further comprise one or more of air-cooling fins extending from an interior wall into the channel or air-turbulence-inducing structures disposed within each of the channels.

20. The computing rack of claim 18, further comprising:

one or more airflow restrictors attached to the second end of the first and second rails, the one or more airflow restrictors configured to increase air pressure within the interior channel of the rails.

\* \* \* \* \*